(12) United States Patent
Choi

(10) Patent No.: US 8,959,378 B2
(45) Date of Patent: Feb. 17, 2015

(54) OUTPUT TIMING CONTROL CIRCUIT AND SEMICONDUCTOR APPARATUS USING THE SAME

(75) Inventor: Hoon Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 820 days.

(21) Appl. No.: 13/219,657

(22) Filed: Aug. 27, 2011

(65) Prior Publication Data

US 2012/0140869 A1 Jun. 7, 2012

(30) Foreign Application Priority Data

Dec. 7, 2010 (KR) .................. 10-2010-0124197

(51) Int. Cl.
*G06F 1/00* (2006.01)
*H03K 5/13* (2014.01)

(52) U.S. Cl.
CPC .................... *H03K 5/131* (2013.01)
USPC .......................... 713/500; 713/501; 713/401

(58) Field of Classification Search
USPC .......................... 713/500, 401, 501
See application file for complete search history.

(56) References Cited

U.S. PATENT DOCUMENTS

2007/0025481 A1* 2/2007 Ryu et al. ............. 375/354
2010/0277992 A1* 11/2010 Noh ................. 365/189.14

FOREIGN PATENT DOCUMENTS

KR 10-1996-0003094 A 1/1996
KR 10-0834401 B1 5/2008

* cited by examiner

*Primary Examiner* — Jaweed A Abbaszadeh
*Assistant Examiner* — Alyaa T Mazyad
(74) *Attorney, Agent, or Firm* — William Park & Associates Patent Ltd.

(57) ABSTRACT

An output timing control circuit of a semiconductor apparatus includes a delay amount counter block configured to count a delay amount of an output reset pulse signal based on an external clock signal and output a first counting code, wherein the delay amount counter block is configured to control the delay amount of the output reset pulse signal depending upon a frequency of the external clock signal; an operation block configured to subtract a code value of the first counting code from a code value of a data output delay code, and output a delay control code; and a phase control block configured to control a phase of a read command signal by the number of clocks of a DLL clock signal corresponding to a code value of the delay control code, and output an output enable flag signal.

16 Claims, 4 Drawing Sheets

OUTPUT TIMING CONTROL CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2010-0124197, filed on Dec. 7, 2010, in the Korean Intellectual Property Office, which is incorporated herein by reference in its entirety.

BACKGROUND

1. Technical Field

The present invention relates generally to a semiconductor apparatus, and more particularly, to a technology for controlling an output timing of output data according to data output delay information.

2. Related Art

A semiconductor apparatus operates in synchronization with a reference periodic pulse signal such as a clock, in order to increase an operation speed and ensure an efficient internal operation. Accordingly, most semiconductor apparatuses operate using a clock supplied form an outside or an internal clock generated therein.

Since a signal transmitted from a transmitter, e.g., a semiconductor memory apparatus may be affected by an environment, if data affected by the environment is transmitted from the transmitter without a clock which may be adjusted according to the environment, a receiver of the data may not sample the data correctly. Accordingly, the adjusted clock may be used to enhance timing characteristics, and a delay locked loop (DLL) or a phase locked loop (PLL) may be used to generate the adjusted clock.

If a read command is inputted to the semiconductor apparatus, a timing at which output data is to be outputted is controlled according to data output delay information. The data output delay information is information indicating after which clocks from a time at which the read command is inputted the output data is to be outputted.

In the case where a clock signal, which a semiconductor apparatus operates is using, varies, a timing margin required when controlling the output timing of output data may deteriorate.

SUMMARY

An output timing control circuit which can activate at a desired timing an output enable flag signal for controlling an output timing of output data through a wide frequency band is described herein.

Also, a semiconductor apparatus capable of stably controlling an output timing of output data through a wide frequency band is described herein.

In an embodiment of the present invention, an output timing control circuit of a semiconductor apparatus includes: a delay amount counter block configured to count a delay amount of an output reset pulse signal based on an external clock signal and output a first counting code, wherein the delay amount counter block is configured to control the delay amount of the output reset pulse signal depending upon a frequency of the external clock signal; an operation block configured to subtract a code value of the first counting code from a code value of a data output delay code, and output a delay control code; and a phase control block configured to control a phase of a read command signal by the number of clocks of a DLL clock signal corresponding to a code value of the delay control code, and output an output enable flag signal.

In an embodiment of the present invention, a semiconductor apparatus includes: a variable delay unit configured to control a delay amount of an external clock signal under the control of a phase detection signal, and output a DLL clock signal; a first delay model unit configured to delay the DLL clock signal by a predetermined model delay value, and output a feedback clock signal; a phase comparison unit configured to compare phases of the external clock signal and the feedback clock signal, and output a comparison result as the phase detection signal; a delay amount counter block configured to count a delay amount of an output reset pulse signal based on the external clock signal and output a first counting code, wherein the delay amount counter block is configured to control the delay amount of the output reset pulse signal depending upon a frequency of the external clock signal; an operation block configured to subtract a code value of the first counting code from a code value of a data output delay code, and output a delay control code; and a phase control block configured to control a phase of a read command signal by the number of clocks of the DLL clock signal corresponding to a code value of the delay control code, and output an output enable flag signal.

BRIEF DESCRIPTION OF THE DRAWINGS

Features, aspects, and embodiments are described in conjunction with the attached drawings, in which.

DETAILED DESCRIPTION

Hereinafter, an output timing control circuit and a semiconductor apparatus using the same according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry.

Figure 1:
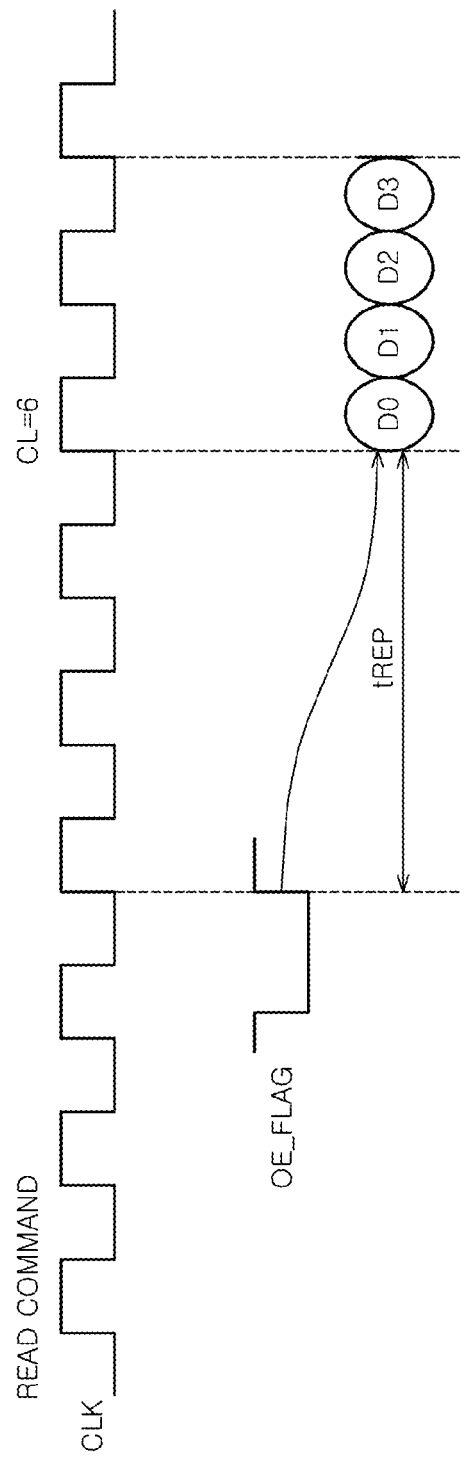
FIG. 1 is a timing diagram showing a timing at which output data is outputted according to data output delay information.

FIG. 1 is a timing diagram showing a timing at which output data is outputted according to data output delay information.

Referring to FIG. 1, an activation timing of an output enable flag signal OE_FLAG, on which data output delay information is reflected, is advanced by a model delay value tREP from a time at which output data is to be outputted. Further, the activation timing of the output enable flag signal OE_FLAG may be advanced or delayed relative to the time point advanced by a model delay value tREP from a time at which output data is to be outputted in order to be in synchronization with a clock signal CLK according to a CAS latency. Here, data output delay information may comprise a CAS latency. The CAS latency is a delay, in clock cycle, between a read command and availability of the first bit of an output data. For example, a CAS latency of 6 means that the first bit of the output data may be outputted after six clocks from a time at which a read command is inputted.

For reference, the model delay value tREP is acquired by modeling the delay factors of a clock transfer path.

Figure 2:
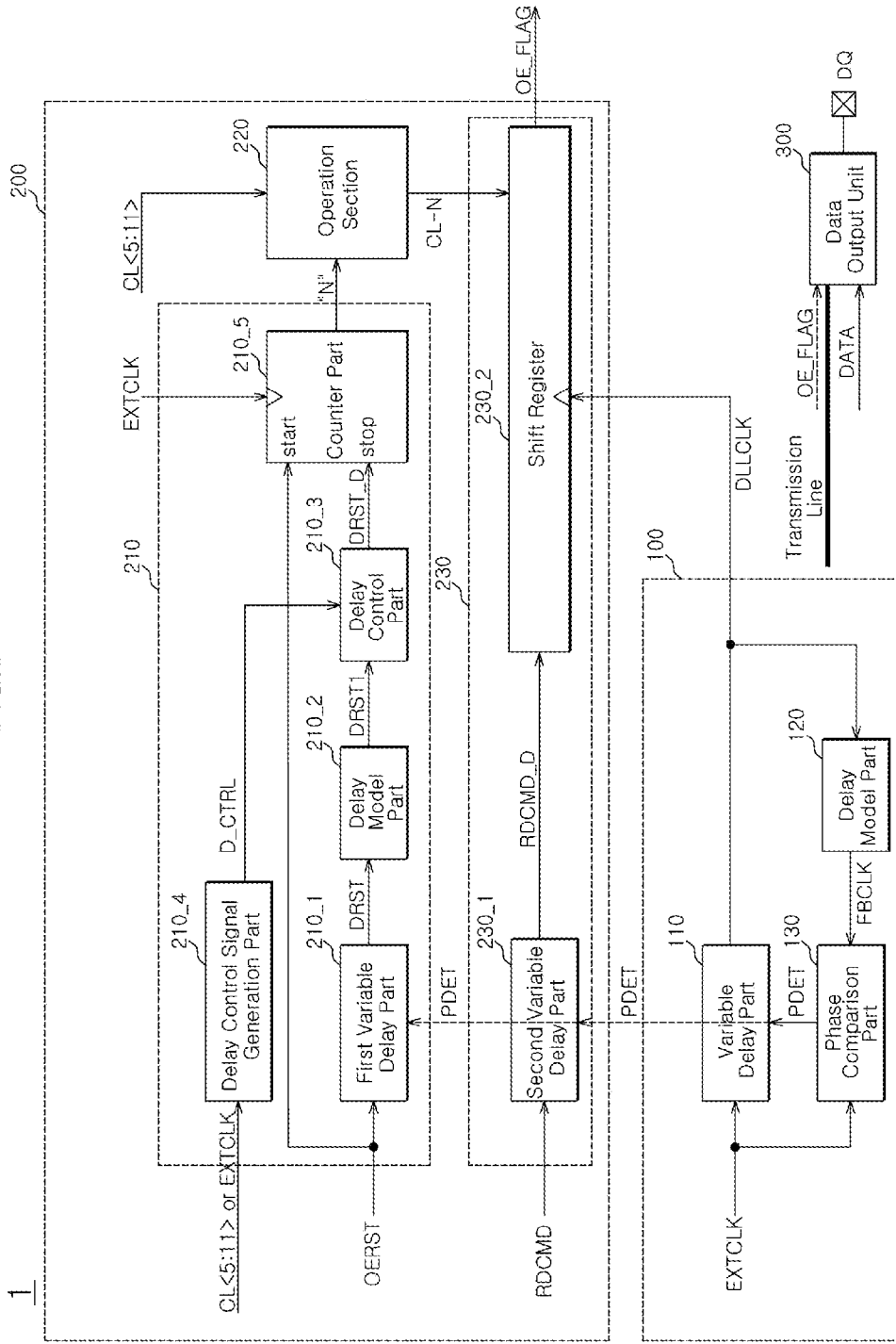
FIG. 2 is a configuration diagram of a semiconductor apparatus in accordance with an embodiment of the present invention.

FIG. 2 is a configuration diagram of a semiconductor apparatus in accordance with an embodiment of the present invention.

The semiconductor apparatus 1 in accordance with an embodiment of the invention includes only a simplified configuration for the sake of clear description of the technical spirit to be suggested.

Referring to FIG. 2, a semiconductor apparatus 1 includes a delay locked loop (DLL) 100, an output timing control unit 200, and a data output unit 300. In an embodiment, the DLL 100 comprises a variable delay unit 110, a delay model unit 120, and a phase comparison unit 130. The output timing control unit 200 comprises a delay amount counter block 210, an operation block 220, and a phase control block 230.

The detailed configuration and the principal operations of the semiconductor apparatus configured as mentioned above will be described below.

The variable delay unit 110 is configured to control the delay amount of an external clock signal EXTCLK under the control of a phase detection signal PDET and output a DLL clock signal DLLCLK.

The delay model unit 120 is configured to delay the DLL clock signal DLLCLK by a certain model delay value and output a feedback clock signal FBCLK. The delay model unit 120 is configured to model the delay factors of a transfer path of the DLL clock signal DLLCLK.

The phase comparison unit 130 is configured to compare the phases of the external clock signal EXTCLK and the feedback clock signal FBCLK and output a comparison result as the phase detection signal PDET. The phase comparison unit 130 continuously performs a comparison operation until the phases of the external clock signal EXTCLK and the feedback clock signal FBCLK become the same, and reflects the comparison result on the phase detection signal PDET. If the phases of the external clock signal EXTCLK and the feedback clock signal FBCLK become the same, the phase comparison unit 130 maintains the phase detection signal PDET at that time in a locked state. This may represent that the DLL 100 is locked. For reference, when the DLL is locked, the phase of the DLL clock signal DLLCLK is advanced by a model delay value tREP when compared to the phase of the external clock signal EXTCLK.

The delay amount counter block 210 is configured to count the delay amount of an output reset pulse signal OERST based on the external clock signal EXTCLK and output a first counting code N. The delay amount counter block 210 is configured to control the delay amount of the output reset pulse signal OERST depending upon the frequency of the external clock signal EXTCLK. While it is configured in an embodiment that an increased delay amount is reflected on the output reset pulse signal OERST as the frequency of the external clock signal EXTCLK becomes slow, it may be configured that an increased delay amount is reflected on the output reset pulse signal OERST as the frequency of the external clock signal EXTCLK becomes fast. The output reset pulse signal OERST is a signal which is activated after the DLL 100 is locked. That is to say, the output timing control unit 200 starts an internal operation after the DLL 100 is locked.

In an embodiment, the delay amount counter block 210 includes a first variable delay unit 210_1, a delay model unit 210_2, a delay control unit 210_3, a delay control signal generation unit 210_4, and a counter unit 210_5.

The first variable delay unit 210_1 is configured to control the delay amount of the output reset pulse signal OERST according to the phase detection signal PDET and output a first delayed signal DRST.

The delay model unit 210_2 is configured to delay the first delayed signal DRST by a certain model delay value and output a second delayed signal DRST1.

The delay control signal generation unit 210_4 is configured to detect the frequency of the external clock signal EXTCLK and output a detection result as a delay control signal D_CTRL. For reference, since a large value of a CAS latency may mean that the frequency of the external clock signal EXTCLK is fast, the delay control signal generation unit 210_4 may also be configured to detect the value of a CAS latency and generate the delay control signal D_CTRL.

The delay control unit 210-3 is configured to control the delay amount of the second delayed signal DRST1 under the control of the delay control signal D_CTRL and output a third delayed signal DRST_D.

Figure 3:
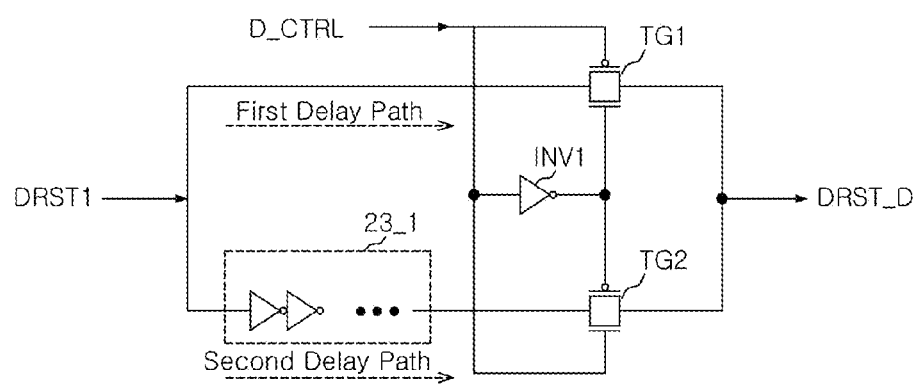
FIG. 3 is a circuit diagram showing an exemplary embodiment of the delay control unit shown in FIG. 2.

FIG. 3 is a circuit diagram showing an exemplary embodiment of the delay control unit shown in FIG. 2.

Referring to FIG. 3, the delay control unit 210_3 includes a first delay path and a second delay path which delay the second delayed signal DRST1 by different delay amounts, and selection stages TG1 and TG2 which selectively output the signal, delayed through any one of the first delay path and the second delay path, as the third delayed signal DRST_D in response to the delay control signal D_CTRL. In an embodiment, the selection stages TG1 and TG2 comprise a plurality of transmission gates. The second delay path has a plurality of unit delay stages 23_1 which are connected in series.

Referring back to FIG. 2, the counter unit 210_5 is configured to perform a counting operation under the control of the external clock signal EXTCLK and output the first counting code N. The counter unit 210_5 starts counting in response to the output reset pulse signal OERST and ends counting in response to the third delayed signal DRST_D. Here, if the timing margin of the third delayed signal DRST_D is not sufficient, the counter unit 210_5 may perform a counting operation once more or once less. In an embodiment, since the delay amount of the third delayed signal DRST_D is controlled depending upon the frequency of the external clock signal EXTCLK, even when the frequency of the external clock signal EXTCLK is changed, the timing margin of the third delayed signal DRST_D may be secured sufficiently, whereby the counting operation may be performed a desired number of times.

The operation block 220 is configured to subtract the code value of the first counting code N from the code value of a data output delay code CL<5:11> and output a delay control code CL-N. The data output delay code CL<5:11> indicates the value of a CAS latency.

The phase control block 230 is configured to control the phase of a read command signal RDCMD by the number of clocks of the DLL clock signal DLLCLK corresponding to the code value of the delay control code CL-N, and output an output enable flag signal OE_FLAG.

In an embodiment, the phase control block 230 includes a second variable delay unit 230_1 and a shift register 230_2.

The second variable delay unit 230_1 is configured to control the delay amount of the read command signal RDCMD under the control of the phase detection signal PDET and output a delayed read command signal RDCMD_D.

The shift register 230_2 is configured to shift the delayed read command signal RDCMD_D by the code value of the delay control code CL-N under the control of the DLL clock signal DLLCLK and output the output enable flag signal OE_FLAG.

For reference, the delay amounts of the first variable delay unit 210_1 and the second variable delay unit 230_1 of the output timing control unit 200 are set to be the same as the delay amount of the variable delay unit 110 of the DLL 100. Also, the delay amounts of the delay model unit 210_2 of the output timing control unit 200 and the delay model unit 120 of the DLL 100 are set to be the same with each other. That is to say, both the delay model units 210_2 and 120 are configured to model the delay factors of a transfer path of the DLL clock signal DLLCLK.

The data output unit 300 is configured to output output data DATA to an output pad DQ in response to the output enable flag signal OE_FLAG transmitted through a transmission line. The output data DATA may be controlled in its output timing by a preset CAS latency. The output data DATA is outputted by being synchronized with the rising edge of the external clock signal EXTCLK.

Figure 4:
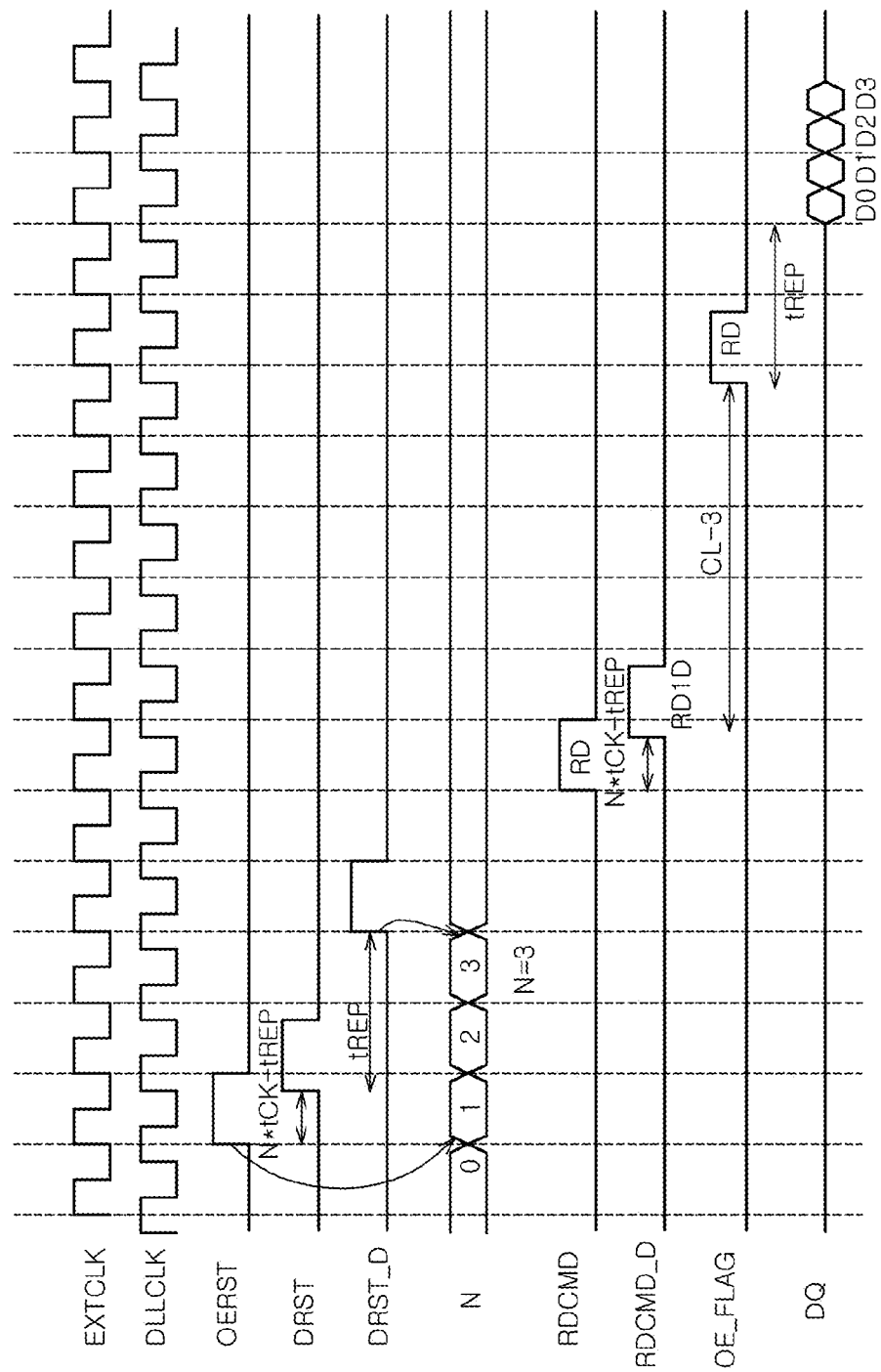
FIG. 4 is a timing diagram showing internal operations of the semiconductor apparatus shown in FIG. 2.

FIG. 4 is a timing diagram showing internal operations of the semiconductor apparatus shown in FIG. 2.

Main operations of the semiconductor apparatus configured as mentioned above will be described below with reference to the timing diagram of FIG. 4.

First, it is assumed that a CAS latency is set to 8 and the DLL 100 is locked.

If the output reset pulse signal OERST is activated to a high level, the first delayed signal DRST delayed in the phase thereof by tCK-tREP is generated by the first variable delay unit 210_1. Also, the second delayed signal DRST1 delayed by the model delay value tREP is generated by the delay model unit 210_2. The delay control unit 210_3 outputs the second delayed signal DRST1 as the third delayed signal DRST_D without delay or output the second delayed signal DRST1 as the third delayed signal DRST_D by reflecting a specific delay value, depending upon the frequency of the external clock signal EXTCLK.

Next, the counter unit 210_5 counts the delay amounts of the first variable delay unit 210_1, the delay model unit 210_2 and the delay control unit 210_3, and outputs the first counting code N.

If the read command signal RDCMD is inputted, the second variable delay unit 230_1 delays the read command signal RDCMD and outputs the delayed read command signal RDCMD_D.

The shift register 230_2 shifts the delayed read command signal RDCMD_D by the code value of the delay control code CL-N and generates the output enable flag signal OE_FLAG.

As a result, output data to be outputted under the control of the output enable flag signal OE_FLAG is outputted in synchronization with the rising edge of the external clock signal EXTCLK while satisfying a preset CAS latency.

As is apparent from the above descriptions, the output timing control circuit according to the embodiment of the present invention can activate at a desired timing an output enable flag signal for controlling an output timing of output data covering a wide frequency band. Also, the semiconductor apparatus according to an embodiment of the present invention can stably control an output timing of output data covering a wide frequency band.

While certain embodiments have been described above, it will be understood to those skilled in the art that the embodiments described are by way of example only. Accordingly, the output timing control circuit and the semiconductor apparatus using the same described herein should not be limited based on the described embodiments. Rather, the output timing control circuit and the semiconductor apparatus using the same described herein should only be limited in light of the claims that follow when taken in conjunction with the above description and accompanying drawings.

What is claimed is:

1. An output timing control circuit of a semiconductor apparatus, comprising:
   a delay amount counter block configured to count a delay amount of an output reset pulse signal based on an external clock signal and output a first counting code, wherein the delay amount counter block is configured to control the delay amount of the output reset pulse signal depending upon a frequency of the external clock signal;
   an operation block configured to subtract a code value of the first counting code from a code value of a data output delay code, and output a delay control code; and
   a phase control block configured to control a phase of a read command signal by the number of clocks of a DLL clock signal corresponding to a code value of the delay control code, and output an output enable flag signal,
   wherein the delay amount counter block comprises:
      a first variable delay unit configured to adjust the delay amount of the output reset pulse signal under the control of a phase detection signal, and output a first delayed signal;
      a delay model unit configured to delay the first delayed signal by a first model delay value, and output a second delayed signal;
      a delay control signal generation unit configured to detect the frequency of the external clock signal, and output a detection result as a delay control signal;
      a delay control unit configured to control a delay amount of the second delayed signal under the control of the delay control signal, and output a third delayed signal; and
      a counter unit configured to perform a counting operation under the control of the external clock signal, and output the first counting code,
   wherein the counter unit starts counting in response to the output reset pulse signal and ends counting in response to the third delayed signal.

2. The output timing control circuit according to claim 1, wherein the phase control block comprises:
   a second variable delay unit configured to adjust a delay amount of the read command signal under the control of the phase detection signal, and output a delayed read command signal; and
   a shift register configured to shift the delayed read command signal by the code value of the delay control code under the control of the DLL clock signal, and output the output enable flag signal.

3. The output timing control circuit according to claim 2, wherein the first and second variable delay units are configured to have the same delay value as a variable delay unit included in a delay locked loop for generating the DLL clock signal.

4. The output timing control circuit according to claim 3, wherein the phase detection signal is a signal which is outputted from the delay locked loop when the delay locked loop is locked, and is a signal which controls the variable delay unit included in the delay locked loop.

5. The output timing control circuit according to claim 1, wherein the delay model unit is configured to have the same delay amount as a delay model unit included in the delay locked loop for generating the DLL clock signal.

6. The output timing control circuit according to claim 5, wherein the delay model unit is configured to model delay factors of a transfer path of the DLL clock signal.

7. The output timing control circuit according to claim 1, wherein the delay control unit comprises:
   a plurality of delay paths configured to delay the second delayed signal by different delay amounts; and
   selection stages configured to selectively output any one of signals delayed through the plurality of delay paths, as the third delayed signal in response to the delay control signal.

8. The output timing control circuit according to claim 1, wherein the output reset pulse signal is activated after the delay locked loop for generating the DLL clock signal is locked.

9. A semiconductor apparatus comprising:
   a variable delay unit configured to control a delay amount of an external clock signal under the control of a phase detection signal, and output a DLL clock signal;
   a first delay model unit configured to delay the DLL clock signal by a first model delay value, and output a feedback clock signal;
   a phase comparison unit configured to compare phases of the external clock signal and the feedback clock signal, and output a comparison result as the phase detection signal;
   a delay amount counter block configured to count a delay amount of an output reset pulse signal based on the external clock signal and output a first counting code, wherein the delay amount counter block is configured to control the delay amount of the output reset pulse signal depending upon a frequency of the external clock signal;
   an operation block configured to subtract a code value of the first counting code from a code value of a data output delay code, and output a delay control code; and
   a phase control block configured to control a phase of a read command signal by the number of clocks of the DLL clock signal corresponding to a code value of the delay control code, and output an output enable flag signal.

10. The semiconductor apparatus according to claim 9, further comprising:
    a data output unit configured to output output data in response to the output enable flag signal transmitted through a transmission line.

11. The semiconductor apparatus according to claim 9, wherein the delay amount counter block comprises:
    a first variable delay unit configured to adjust the delay amount of the output reset pulse signal under the control of the phase detection signal, and output a first delayed signal;
    a second delay model unit configured to delay the first delayed signal by a first model delay value, and output a second delayed signal;
    a delay control signal generation unit configured to detect the frequency of the external clock signal, and output a detection result as a delay control signal;
    a delay control unit configured to control a delay amount of the second delayed signal under the control of the delay control signal, and output a third delayed signal; and
    a counter unit configured to perform a counting operation under the control of the external clock signal, and output the first counting code, wherein the counter unit starts counting in response to the output reset pulse signal and ends counting in response to the third delayed signal.

12. The semiconductor apparatus according to claim 11, wherein the phase control block comprises:
    a second variable delay unit configured to adjust a delay amount of the read command signal under the control of the phase detection signal, and output a delayed read command signal; and
    a shift register configured to shift the delayed read command signal by the code value of the delay control code under the control of the DLL clock signal, and output the output enable flag signal.

13. The semiconductor apparatus according to claim 12, wherein the first and second variable delay units are configured to have the same delay value as the variable delay unit.

14. The semiconductor apparatus according to claim 11, wherein the first and second delay model units have the same delay amount.

15. The semiconductor apparatus according to claim 11, wherein the first and second delay model units are configured to model delay factors of a transfer path of the DLL clock signal.

16. The semiconductor apparatus according to claim 11, wherein the delay control unit comprises:
    a plurality of delay paths configured to delay the second delayed signal by different delay amounts; and
    selection stages configured to selectively output any one of signals delayed through the plurality of delay paths, as the third delayed signal in response to the delay control signal.

* * * * *